United States Patent [19]

Tsai et al.

[11] Patent Number: 5,283,714
[45] Date of Patent: Feb. 1, 1994

[54] DOCKING APPARATUS FOR A PORTABLE COMPUTER

[75] Inventors: Collins Tsai; Ray Lan, both of Taipei City, Taiwan

[73] Assignee: Mitac International Corp., Taiwan

[21] Appl. No.: 977,761

[22] Filed: Nov. 17, 1992

[51] Int. Cl.$^5$ .................. H05K 7/10; G06F 1/16; H01R 13/62
[52] U.S. Cl. .................. 361/683; 439/160; 312/330.1
[58] Field of Search ............... 439/152, 153, 159, 160; 312/319.1, 223.2, 333, 330.1, 223.3; 361/339, 343, 380, 390–395, 399, 413, 415, 679–687; 364/708, 708.1

[56] References Cited

U.S. PATENT DOCUMENTS 5,159,533 10/1992 Kuang .................. 361/391
5,182,698 1/1993 Kobayashi et al. .................. 361/395
5,209,583 5/1993 Lewis et al. .................. 361/391 X Primary Examiner—Lincoln Donovan
Assistant Examiner—Michael W. Phillips
Attorney, Agent, or Firm—Ladas & Parry

[57] ABSTRACT

The docking apparatus, which is used for a portable computer with a first connector unit, includes a housing, which has a front side, and a second connector unit which is mounted in the housing and which protrudes from the front side. A computer support extends forwardly from the front side and has a top wall which supports the portable computer so that the first connector unit engages the second connector unit. An elongated rod is mounted pivotally in the housing and is disposed parallel to the front side. A lever has a front part, a rear part and an intermediate part disposed between the front and rear parts. The lever is mounted in the computer support and is movable longitudinally between a normal rear position and a front position. A crank is fixed to the elongated rod and engages slidably the lever. A pushing unit is mounted on the elongated rod and protrudes through the front side in order to push the portable computer forward.

7 Claims, 5 Drawing Sheets

DOCKING APPARATUS FOR A PORTABLE COMPUTER

BACKGROUND OF THE INVENTION

1. Field of the Invention

This invention relates to a docking apparatus, more particularly to an improved docking apparatus for a portable computer, which apparatus has an improved releasing mechanism that releases effectively the portable computer from the docking apparatus.

2. Description of the Related Art

Generally, a portable computer, such as a notebook computer or a laptop computer, has a relatively small volume and occupies a relatively small space. Therefore, the uses and functions of the portable computer are limited because the expansion slots found in most personal computers have been eliminated. A docking apparatus is needed to connect the portable computer to an I/O device. The docking apparatus provides the required expansion slots, thereby increasing the functionality and the utility of the portable computer.

FIG. 1 shows an example of a conventional docking apparatus (D1). The conventional docking apparatus (D1) includes a housing (H1) which has a front side (F1), a connector (12) which is mounted in the housing (H1) and which protrudes from the front side (F1), and a computer support (S1) which extends forwardly from the front side (F1). The computer support (S1) is used to support a portable computer (not shown) thereon so that a connector of the portable computer engages the connector (12) of the docking apparatus (D1). The docking apparatus (D1) has a release mechanism (R1) which is used to push the portable computer away from the front side (F1) of the housing (H1) in order to disengage the connector of the portable computer from the connector (12) of the docking apparatus (D1). The release mechanism (R1) includes a lever (13) which has a first end formed with a push member (14) that is mounted on the front side (F1) adjacent to a center portion of the connector (12), and a second end formed with a slide member (15). The connector of the portable computer disengages from the connector (12) of the docking apparatus (D1), while the portable computer moves away from the front side (F1) of the housing (H1) when the slide member (15) is moved rearward by the application of a force of about 5 to 8 kgf thereto so as to cause the push member (14) to push the portable computer forward. The 5 to 8 kgf force is measured when the connector has 110 contacts. The push force, which is used to push the portable computer forward, is applied on one point of the portable computer. Therefore, a non-uniform push force is present at different parts of the portable computer. The application of a non-uniform push force to disengage the connector of the portable computer from the connector (12) of the docking apparatus (D1) can easily cause wearing of the connectors. Wearing of the connectors is more pronounced when each of the portable computer and the docking apparatus (D1) has two or more connectors mounted thereon.

SUMMARY OF THE INVENTION

Therefore, the objective of the present invention is to provide an improved docking apparatus for a portable computer. The improved docking apparatus has an improved release mechanism that can provide a uniform push force for pushing the portable computer away from the docking apparatus so as to disengage a connector of the portable computer from a connector of the docking apparatus.

Accordingly, the docking apparatus of the present invention, which is used for a portable computer with a first connector unit, includes a housing which has a front side, and a second connector unit which is mounted in the housing and which protrudes from the front side. A computer support extends forwardly from the front side and has a top wall which supports the portable computer so that the first connector unit engages the second connector unit. An elongated rod is mounted pivotally in the housing and is disposed parallel to the front side of the housing. A lever has a front part, a rear part and an intermediate part disposed between the front and rear parts. The lever is mounted in the computer support and is movable longitudinally between a normal rear position and a front position. A crank is fixed to the elongated rod and engages slidably the lever. A pushing unit is mounted on the elongated rod and protrudes through the front side of the housing in order to push the portable computer forward.

The elongated rod rotates with the crank when the lever is moved to the front position so as to move the pushing unit forward in order to push the portable computer forward. The portable computer is pushed forward away from the front side of the housing, thereby disengaging the first connector unit of the portable computer from the second connector unit of the docking apparatus.

BRIEF DESCRIPTION OF THE DRAWINGS

Other features and advantages of the present invention will become apparent in the following detailed description of the preferred embodiment, with reference to the accompanying drawings, in which.

DETAILED DESCRIPTION OF THE PREFERRED EMBODIMENT

Figure 1:
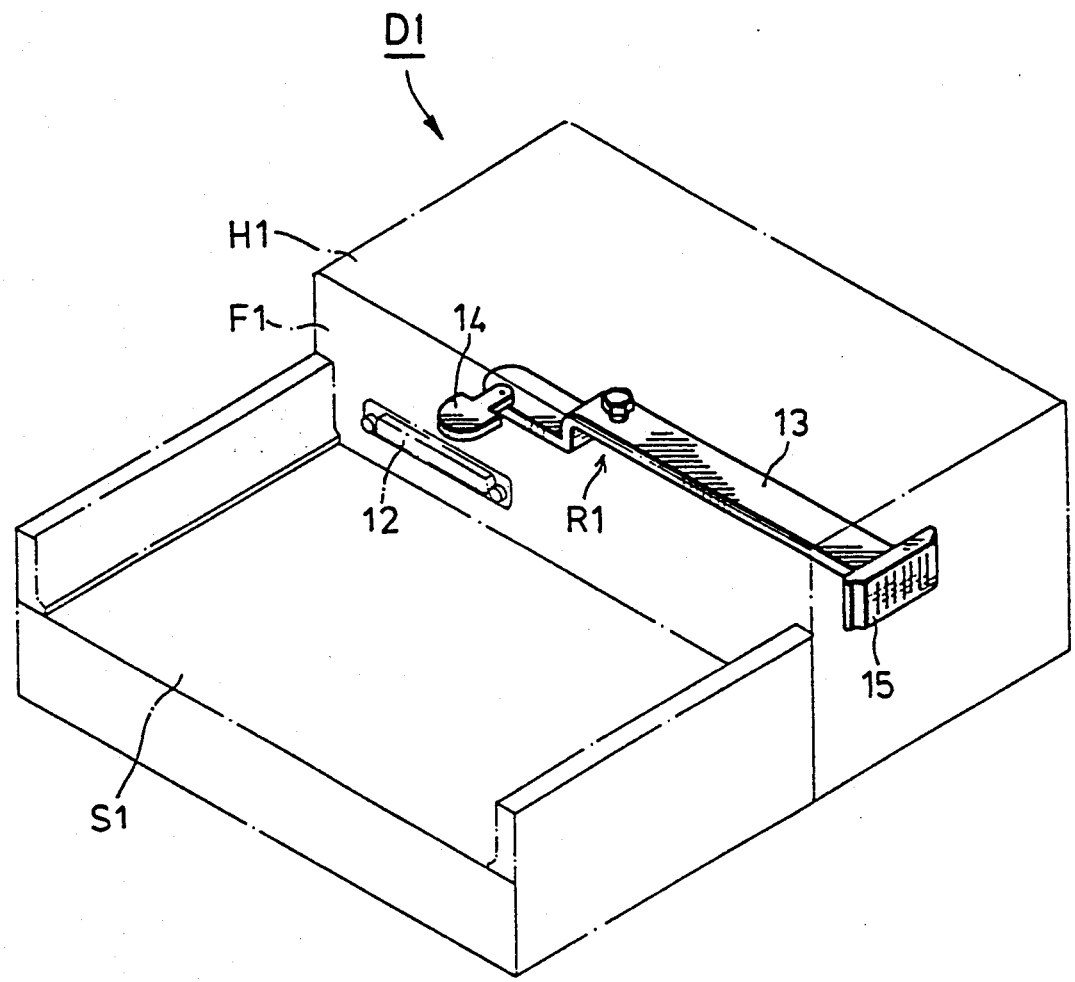
FIG. 1 is a schematic view of a conventional docking apparatus for a portable computer.

Referring to FIGS. 2 to 6, a docking apparatus (D2) of the present invention is used to interconnect a connector (not shown) of a portable computer (50) and an I/O device (not shown). The docking apparatus (D2) includes a housing (H2), which has a front side (F2) formed with two spaced openings (N), and a connector (22) which is mounted in the housing (H2) and which protrudes from the front side (F2). A computer support (S2) extends forwardly from the front side (F2) of the housing (H2) and has a top wall (T) and two side walls (T', T") which extend downwardly from a periphery of the top wall (T). The top wall (T) supports the portable computer (50) thereon so that the connector of the portable computer (50) engages the connector (22) of the docking apparatus (D2).

The docking apparatus (D2) has a release mechanism (R2) which is mounted in the housing (H2) and the computer support (S2) in order to release effectively the portable computer (50) from the docking apparatus (D2). The release mechanism (R2) includes a pair of mounting members (314), which are respectively fixed to a top wall (t) of the housing (H2), and an elongated rod (311) which is pivoted to mounting members (314) and which is disposed parallel to the front side (F2). A lever (33) is mounted in the computer support (S2) and is movable longitudinally between a normal rear position and a front position. The lever (33) has a front part, a rear part, an intermediate part disposed between the front and rear parts, a first oblong slot (331) which is formed on the rear part and which is disposed parallel to the lever (33), and a second oblong slot (332) which is formed inclinedly on the intermediate part and which extends forward and downward. The lever (33) is disposed parallel to and is mounted movably on the side wall (T') of the computer support (S2) by means of a bracket (25), which is fixed to the side wall (T') in order to retain the front part of the lever (33), and a roller (26), which is mounted rotatably on the side wall (T') and which engages rollingly the first oblong slot (331) in order to guide the lever (33) to move forward and rearward. The side wall (T') of the computer support (S2) has an elongated opening (N') formed thereon and disposed adjacent to the front part of the lever (33). The lever (33) further has a hand-operated slide member (333) formed integrally with the front part of the lever (33) and protruding slidably out via the oblong opening (N').

A crank (312) has a first end which is welded to a first free end of the elongated rod (311), a second end, and a stud (312') which projects from the second end and which engages slidably the second oblong slot (332) of the lever (33).

The release mechanism (R2) further includes a pushing unit (P) for pushing the portable computer (50) forward. The pushing unit (P) includes a link (313) which is welded to a second free end of the elongated rod (311). The link (313) is disposed symmetrically with respect the first end of the crank (312). The pushing unit (P) further includes a pair of pushing rods (32) which are pivoted respectively and symmetrically to the link (313) and the first end of the crank (312). Each of the pushing rods (32) has an end which engages movably a respective one of the openings (N) of the front side (F2).

A resilience means is used to move the lever (33) from the front position to the normal rear position. The resilience means includes a tension spring (34) having two ends which are connected respectively to the housing (H2) and to the rear part of the lever (33).

Figure 2:
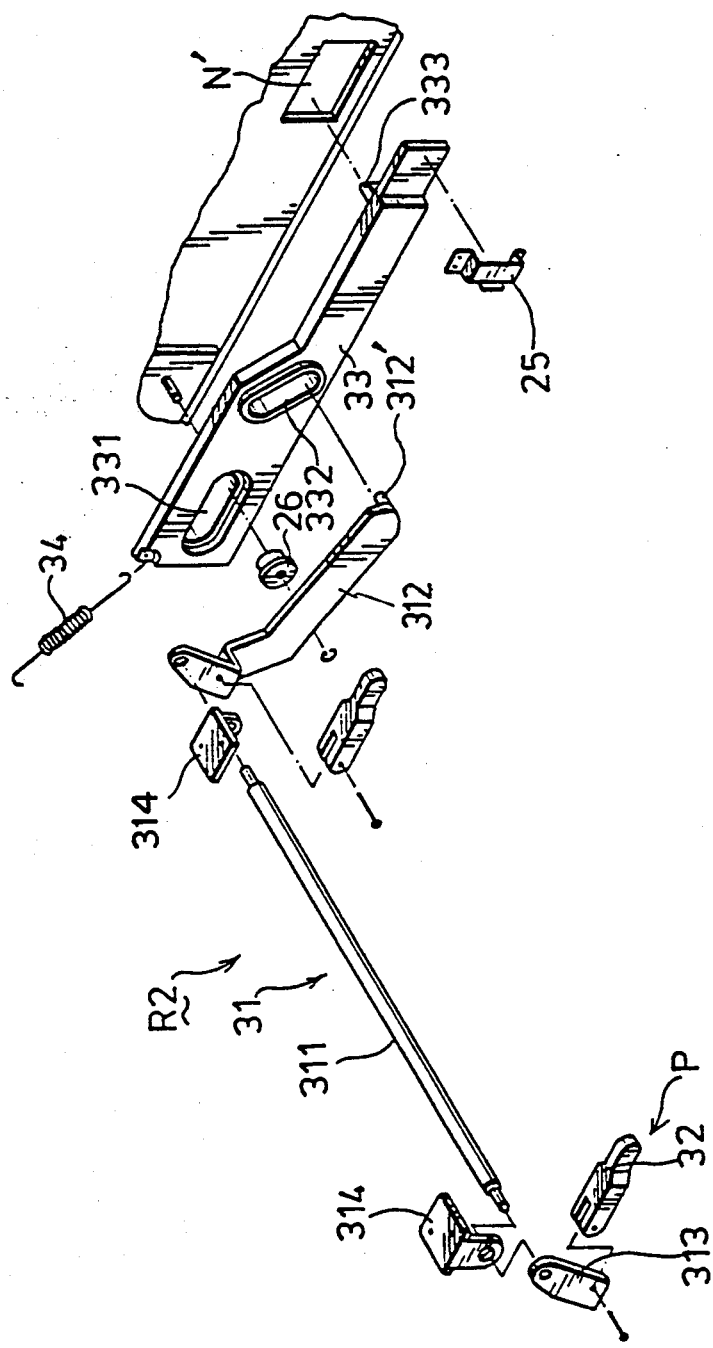
FIG. 2 is an exploded view of a release mechanism of a docking apparatus of the present invention.
Figure 3:
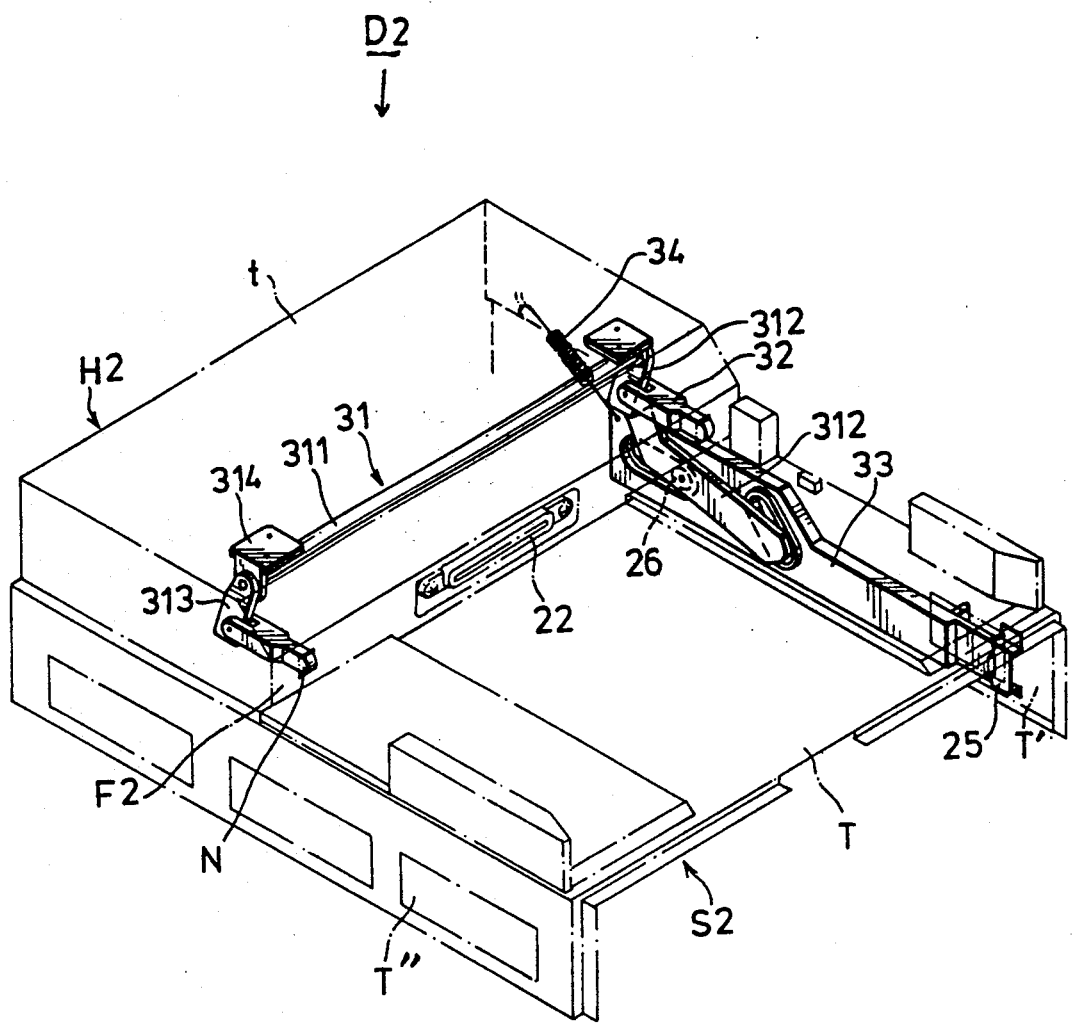
FIG. 3 is a schematic view of the docking apparatus of the present invention.
Figure 4:
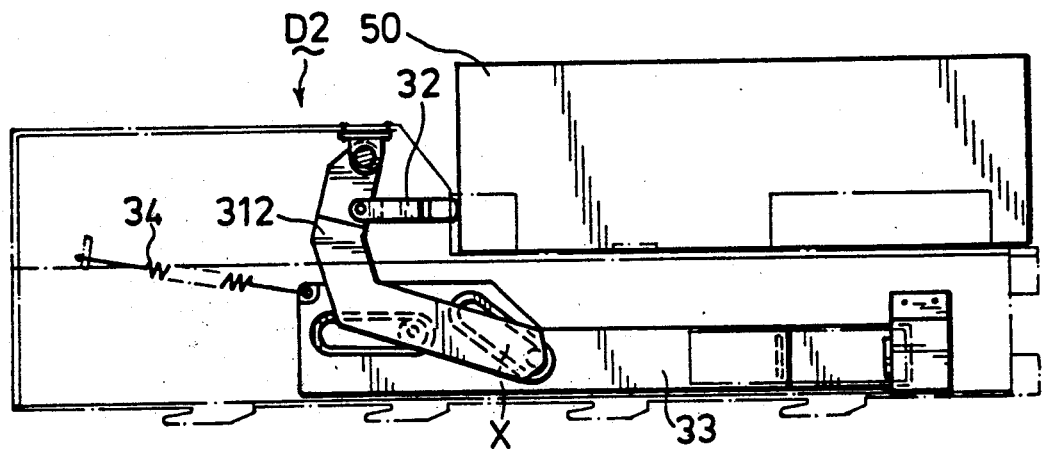
FIG. 4 is a side view of the docking apparatus shown in FIG. 3, which side view shows a lever disposed in a normal rear position.
Figure 5:
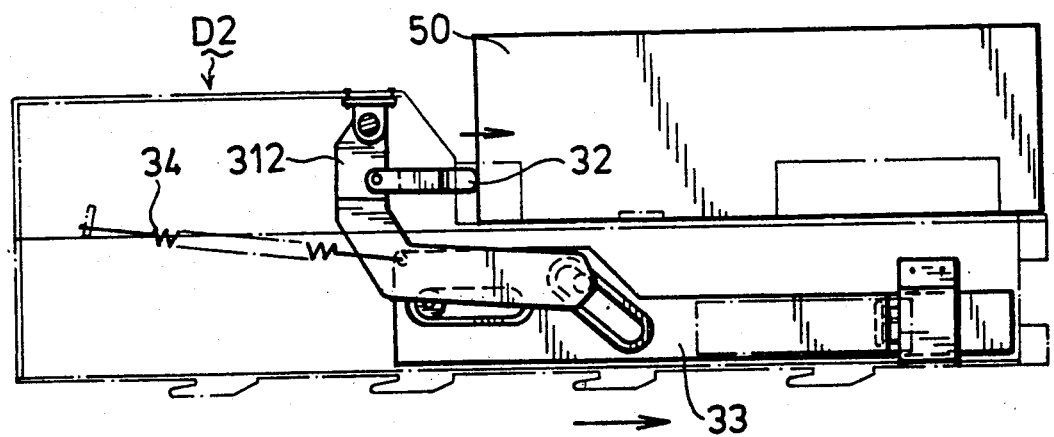
FIG. 5 is a side view of the docking apparatus shown in FIG. 3, which side view shows the lever disposed in a front position.
Figure 6:
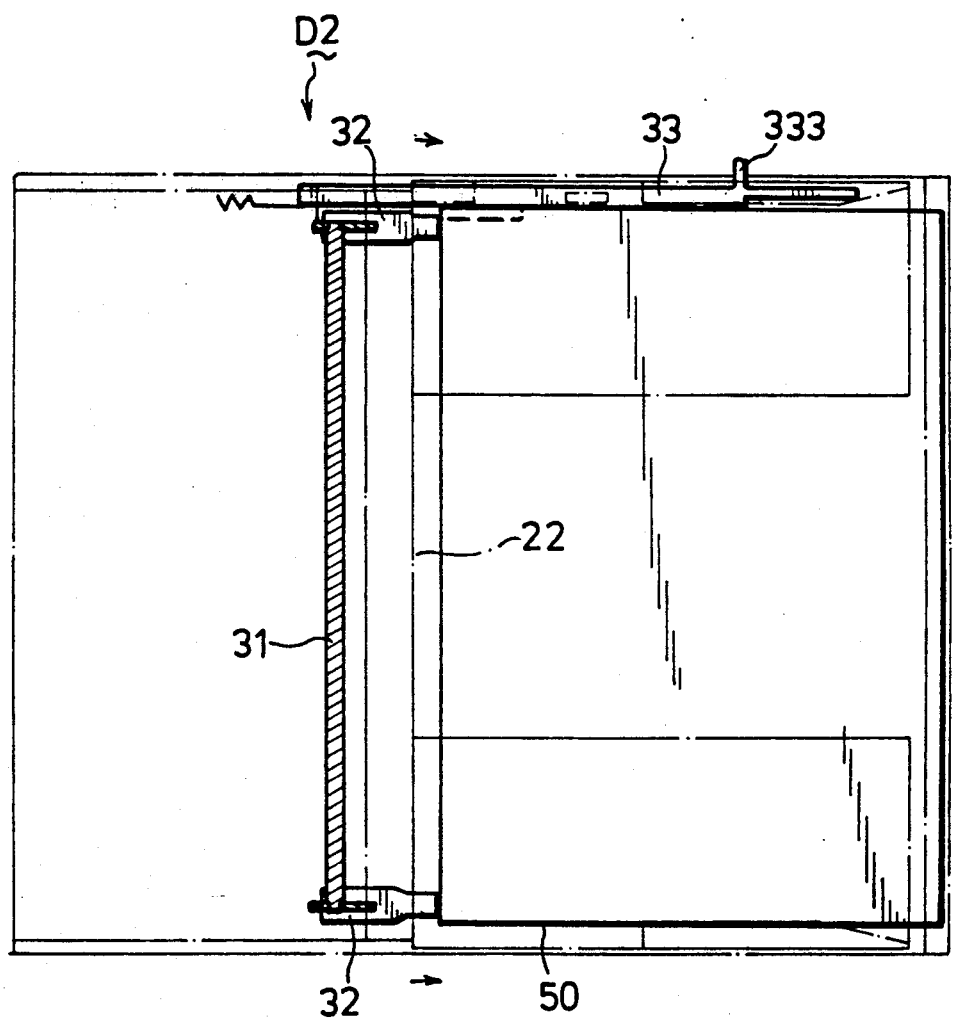
FIG. 6 is a top view of the docking apparatus of the present invention.

FIG. 4 shows the lever (33) disposed in the normal rear position. FIG. 5 shows the lever (33) moved to the front position. The lever (33) is moved from the normal rear position to the front position when the hand of an operator urges the slide member. (333) of the lever (33) forward. The stud (312'), FIG. 2, is cammed by the inclined side (x) of the second oblong slot (332) and is moved upward along a curve path, thereby turning the crank (312) upward. At this time, the elongated rod (311) rotates with the crank (312) so as to move the pushing rods (32) forward in order to push the portable computer (50) away from the front side (F2) of the housing (H2), thereby disengaging the connector of the computer portable (50) from the connector (22) of the docking apparatus (D2). The portable computer (50) is thus released from the docking apparatus (D2).

The push force, which is used to push the portable computer (50) forward, is applied on two spaced and symmetrical points of the portable computer (50). A uniform push force is thus present at different parts of the portable computer. The application of the uniform push force to disengage the connector of the portable computer (50) from the connector (22) of the docking apparatus (D2) can reduce wearing of the connectors and can prolong the service lives of the latter.

Preferably, the ratio of the arm of application force to the arm of resistance force for the release mechanism (R2) is arranged to be about 10. Due to the presence of the inclined second oblong slot (332), the crank (312) can be turned efficiently just by pulling the slide member (333) in a forward direction, thereby releasing efficiently the portable computer (50) from the docking apparatus (D2).

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

I claim:
1. A docking apparatus for a portable computer which has a first connector unit, comprising:
    a housing having a front side;
    a second connector unit mounted in said housing and protruding from said front side;
    a computer support extending forwardly from said front side, said computer support having a top wall which supports the portable computer so that the first connector unit is engageable with said second connector unit;
    an elongated rod mounted pivotally in said housing and being disposed parallel to said front side of said housing, said elongated rod having two ends;
    a lever having a front part, a rear part and an intermediate part disposed between said front and rear parts, said lever being mounted in said computer support and being movable longitudinally between a normal rear position and a front position;
    a crank fixed to said elongated rod and engaging slidably said lever; and
    a pushing unit mounted on said elongated rod and protruding through said front side of said housing in order to push the portable computer forward;
    said crank being rocked forward and said elongated rod rotating with said crank so as to move said pushing unit forward in order to push the portable computer forward away from said front side of said housing when said lever is, moved to said front position, thereby disengaging the first connector unit of the portable computer from said second connector unit of said docking apparatus.

2. A docking apparatus as claimed in claim 1, wherein said lever has a first oblong slot formed on said rear part thereof, said first oblong slot being disposed parallel to said lever, said lever further having a second oblong slot formed inclinedly on said intermediate part of said lever, said second oblong slot extending forward and downward, said crank having a first end fixed to said elongated rod, a second end, and a stud projecting from said second end and engaging slidably said second oblong slot.

3. A docking apparatus as claimed in claim 2, wherein said front side of said housing has two spaced openings formed thereon, said first end of said crank being fixed to one of said two ends of said elongated rod, said pushing unit including a link which is fixed to said elongated rod at the other one of said two ends thereof, and a pair of pushing rods which are pivoted respectively and symmetrically to said crank and said link, each of said pushing rods having an end engaging movably a respective one of said openings of said front side.

4. A docking apparatus as claimed in claim 3, wherein said top wall of said computer support has a periphery, said computer support further having two opposite side walls which extend respectively downward from said periphery of said top wall and which are disposed parallel to said lever, a bracket mounted on one of said side walls in order to retain said front part of said lever, and a roller mounted rotatably on said one of said side walls and engaging rollingly said first oblong slot in order to guide said lever to move forward and rearward.

5. A docking apparatus as claimed in claim 4, wherein said one of said side walls of said computer support has an elongated opening formed thereon and disposed adjacent to said front part of said lever, said lever further having a hand-operated slide member formed integrally with said front part of said lever and protruding slidably out of said computer support via said oblong opening.

6. A docking apparatus as claimed in claim 1, further comprising a resilience means for moving said lever from said front position to said normal rear position.

7. A docking apparatus as claimed in claim 6, wherein said resilience means includes a tension spring having two ends which are connected respectively to said housing and to said rear part of said lever.

* * * * *